(12) United States Patent
Sato

(10) Patent No.: US 10,669,626 B2
(45) Date of Patent: Jun. 2, 2020

(54) PROCESSING SYSTEM AND PROCESSING METHOD

(71) Applicants: Kabushiki Kaisha Toshiba, Minato-ku, Tokyo (JP); Toshiba Electronic Devices & Storage Corporation, Minato-ku, Tokyo (JP)

(72) Inventor: Shinya Sato, Nonoichi Ishikawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 142 days.

(21) Appl. No.: 15/922,160

(22) Filed: Mar. 15, 2018

(65) Prior Publication Data

US 2018/0371611 A1 Dec. 27, 2018

(30) Foreign Application Priority Data

Jun. 26, 2017 (JP) ................................. 2017-124221

(51) Int. Cl.
| | | |
|---|---|---|
| *B08B 3/00* | (2006.01) | |
| *C23C 16/44* | (2006.01) | |
| *C23C 16/24* | (2006.01) | |
| *C23C 16/02* | (2006.01) | |
| *C23C 16/455* | (2006.01) | |

(Continued)

(52) U.S. Cl.
CPC ...... *C23C 16/4412* (2013.01); *C23C 16/0236* (2013.01); *C23C 16/24* (2013.01); *C23C 16/4404* (2013.01); *C23C 16/4405* (2013.01); *C23C 16/4407* (2013.01); *C23C 16/45563* (2013.01); *H01L 21/67017* (2013.01); *H01L 21/0262* (2013.01); *H01L 21/02532* (2013.01); *H01L 21/67051* (2013.01)

(58) Field of Classification Search
CPC ............ C23C 16/4412; C23C 16/0236; C23C 16/4405; C23C 16/24; C23C 16/45563; C23C 16/4404; C23C 16/4407; H01L 21/02532; H01L 21/0262; H01L 21/67051; H01L 21/67017
USPC .......................................... 137/15.04, 15.09
See application file for complete search history.

(56) References Cited

U.S. PATENT DOCUMENTS 2,518,299 A * 8/1950 Fernandez ............ F25B 41/003
62/299
3,984,131 A * 10/1976 Gingrich, Jr. ....... F16L 25/0072
285/41

(Continued)

FOREIGN PATENT DOCUMENTS

| JP | 2003-124127 A | 4/2003 |
|---|---|---|
| JP | 2011-142257 A | 7/2011 |

(Continued)

*Primary Examiner* — Minh Q Le
(74) *Attorney, Agent, or Firm* — White & Case LLP

(57) ABSTRACT

According to one embodiment, a processing system includes a first vessel, a destination part to be transported, and a liquid sending part. The first vessel gathers a product being liquid temporarily. The destination part to be transported includes a second vessel to gather the product transported from the first vessel. The liquid sending part includes a first portion. The first portion includes a nozzle and a first mechanism. The nozzle discharges the product provided between the first vessel and the destination part to be transported. The first mechanism is purged by an inactive gas.

20 Claims, 8 Drawing Sheets

(51) Int. Cl.
*H01L 21/67* (2006.01)
*H01L 21/02* (2006.01)

(56) References Cited

U.S. PATENT DOCUMENTS

| | | | | |
|---|---|---|---|---|
| 4,111,463 A * | 9/1978 | McFadden | ............... | F16L 39/00 |
| | | | | 285/25 |
| 5,118,486 A * | 6/1992 | Burgie | ............... | C01B 33/02 |
| | | | | 423/342 |
| 5,716,878 A * | 2/1998 | Turner | ............... | G01N 27/60 |
| | | | | 204/298.03 |
| 6,149,729 A * | 11/2000 | Iwata | ............... | C23C 16/4412 |
| | | | | 118/715 |
| 8,261,762 B2 * | 9/2012 | Komiyama | ............... | F17C 5/06 |
| | | | | 134/1.3 |
| 8,657,942 B2 | 2/2014 | Shaw et al. | | |
| 9,027,582 B2 * | 5/2015 | Johnson | ............... | F16L 29/02 |
| | | | | 137/15.04 |
| 9,169,553 B2 * | 10/2015 | Sakai | ............... | C23C 16/45536 |
| 2001/0054818 A1 * | 12/2001 | Fujikawa | ............... | F16L 29/007 |
| | | | | 285/18 |
| 2007/0000828 A1 * | 1/2007 | Norman | ............... | G01N 30/72 |
| | | | | 210/198.2 |
| 2010/0200076 A1 * | 8/2010 | Hieb | ............... | A61M 5/16827 |
| | | | | 137/15.04 |
| 2011/0117729 A1 * | 5/2011 | Osborne | ............... | C23C 16/24 |
| | | | | 438/478 |
| 2012/0304930 A1 * | 12/2012 | Verdict | ............... | C23C 16/4407 |
| | | | | 118/715 |
| 2013/0068317 A1 * | 3/2013 | Cogle | ............... | A62C 33/00 |
| | | | | 137/15.04 |
| 2013/0156950 A1 | 6/2013 | Yamada et al. | | |
| 2015/0136238 A1 * | 5/2015 | Trovant | ............... | F16L 23/167 |
| | | | | 137/15.04 |
| 2015/0136239 A1 * | 5/2015 | Clark | ............... | C23C 14/56 |
| | | | | 137/15.04 |
| 2015/0167882 A1 * | 6/2015 | Von Keitz | ............... | B67D 7/3218 |
| | | | | 137/15.09 |
| 2016/0167185 A1 * | 6/2016 | Nakazawa | ............... | F16L 39/04 |
| | | | | 285/272 |
| 2018/0207581 A1 * | 7/2018 | Bailey | ............... | B01D 53/68 |

FOREIGN PATENT DOCUMENTS

JP 4885943 B2 2/2012
JP 5877702 B2 3/2016

\* cited by examiner

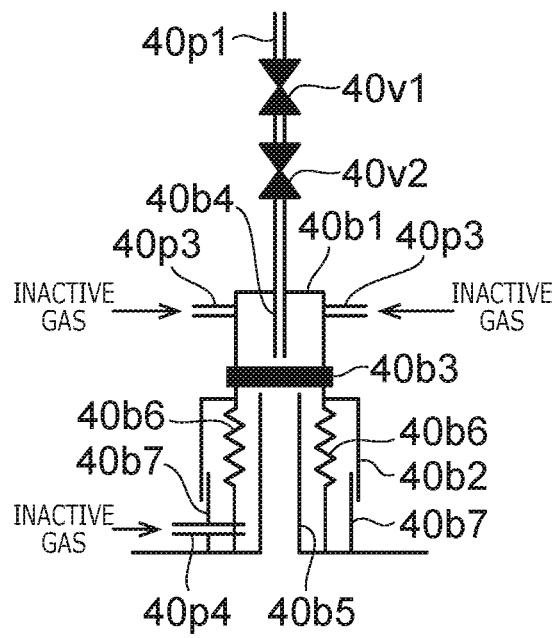
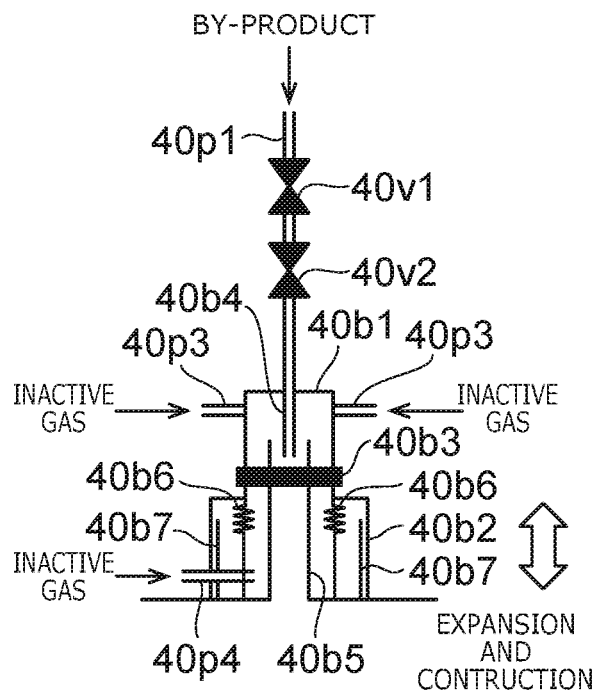
FIG. 4A   FIG. 4B
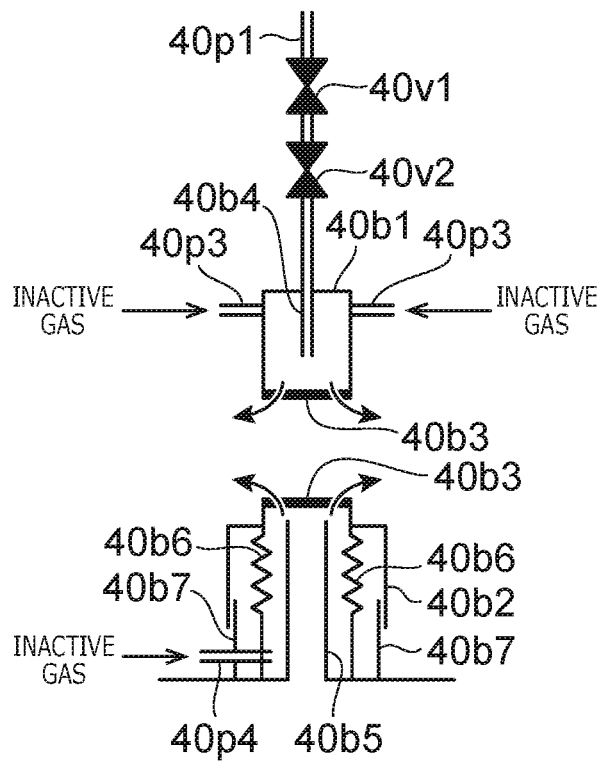
FIG. 5

PROCESSING SYSTEM AND PROCESSING METHOD

CROSS-REFERENCE TO RELATED APPLICATIONS

This application is based upon and claims the benefit of priority from Japanese Patent Application No. 2017-124221, filed on Jun. 26, 2017; the entire contents of which are incorporated herein by reference.

FIELD

Embodiments described herein relate generally to a processing system and a processing method.

BACKGROUND

In a manufacturing process of a semiconductor device, a silicon film may be formed on a substrate. A by-product including silicon may be deposited in a pipe connected to a film formation device. Such by-products react with moisture in the atmosphere, which may inhibit the safety of the manufacturing process. Therefore, a technique is required, which transports the by-products to a processing device without contacting the atmosphere.

BRIEF DESCRIPTION OF THE DRAWINGS

FIG. 4A and FIG. 4B are views showing a portion of the processing system according to the embodiment, respectively;

FIG. 5 is a view showing a portion of the processing system according to the embodiment;

FIG. 10A and FIG. 1013 are views showing a portion of the processing system according to the third variation of the embodiment, respectively.

DETAILED DESCRIPTION

Figure 1:
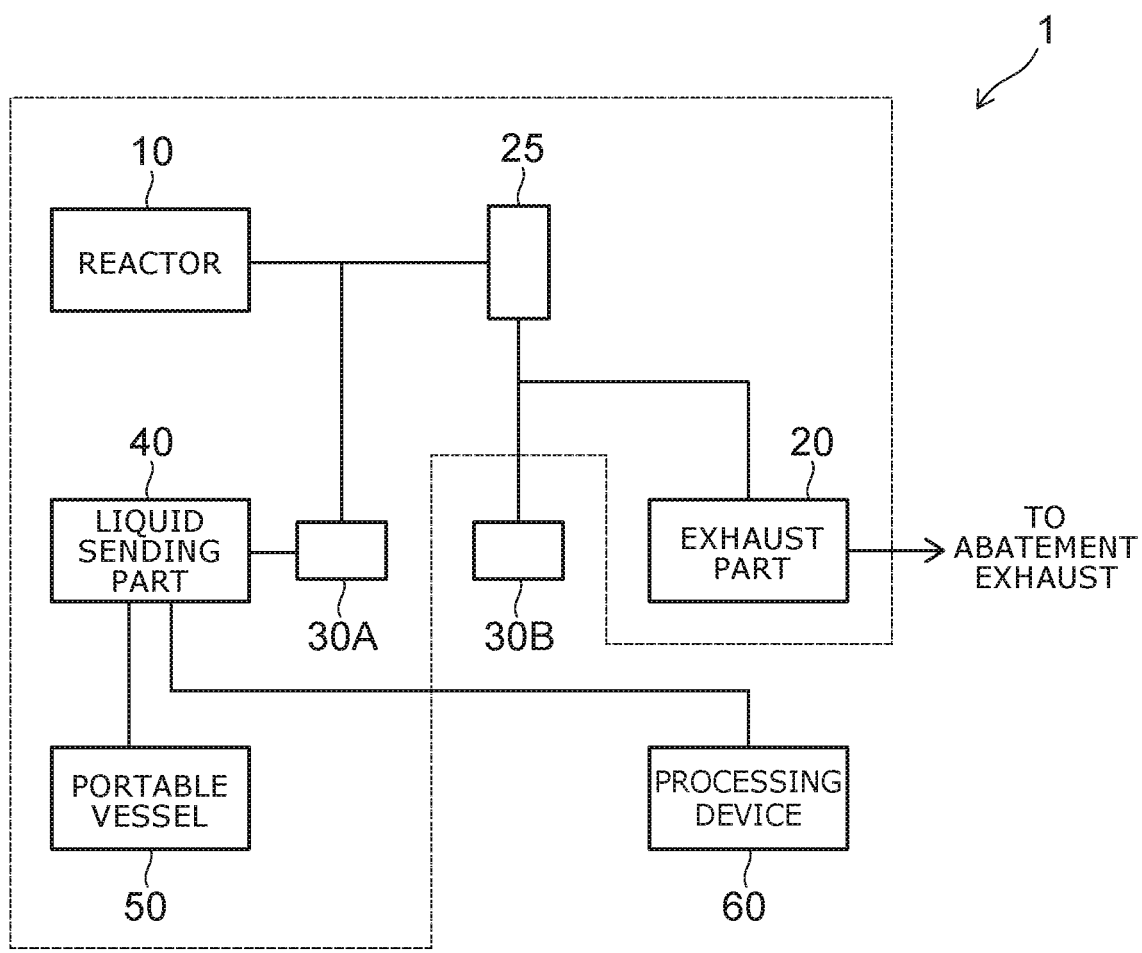
FIG. 1 is a block diagram showing a processing system according to an embodiment.

According to one embodiment, a processing system includes a first vessel, a destination part to be transported, and a liquid sending part. The first vessel gathers a product being liquid temporarily. The destination part to be transported includes a second vessel to gather the product transported from the first vessel. The liquid sending part includes a first portion. The first portion includes a nozzle and a first mechanism. The nozzle discharges the product provided between the first vessel and the destination part to be transported. The first mechanism is purged by an inactive gas.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

(First Embodiment)

FIG. 1 is a block diagram showing a processing system 1 according to an embodiment.

As shown in FIG. 1, the processing system 1 includes a reactor 10, an exhaust part 20, a pressure-regulating part 25, a vessel 30A, a vessel 30B, a liquid sending part 40, a portable vessel 50, and a processing device 60.

The reactor 10 is, for example, a reactor in a film formation device in which silicon is formed on a substrate. The film formation device is, for example, a device (epitaxial growth device) in which the film formation is made by growing silicon by an epitaxial method.

The epitaxial growth is, for example, a vapor phase epitaxy by which components in the gas phase is deposited on the substrate. In the vapor phase epitaxy, the film is formed on a surface of the substrate by causing a chemical reaction of silicon containing gasses. The silicon containing gasses are, for example, monosilane ($SiH_4$), disilane ($Si_2H_6$), dichlorosilane ($SiH_2Cl_2$), trichlorosilane ($SiHCl_3$).

The reactor 10 may be a reactor in a CVD (chemical vapor deposition) in which the film formation is made on the substrate. The reactor 10 may be a reactor in an etching device in which a portion of the film formed on the substrate is removed.

The exhaust part 20 includes, for example, a pump. One end of the exhaust part 20 is connected to the reactor 10 via the pressure-regulating part 25. The other end of the exhaust part 20 is connected to an abatement device (not shown) via a pipe or the like. Gasses occurred in the reactor 10 are sent to the exhaust part 20. The gasses exhausted from the exhaust part 20 are processed by the abatement device, and thereafter discharged to an external space (abatement exhaust).

The pressure-regulating part 25 includes, for example, a valve. The pressure or the like in the vessels 30A, 30B is regulated by the pressure-regulating part 25.

The vessels 30A, 30B are vessels to which the by-products of the chemical reaction in the reactor 10 are gathered. The by-products include a liquid compound and include, for example, a hydrolysable compound. The by-products include, for example, a silicon compound. The by-products include, for example, trichlorosilane and hexachlorosilane ($Si_2Cl_6$).

The vessel 30A and the vessel 30B are connected to the reactor 10 via pipes or the like. The vessel 30A is connected directly to the reactor 10 and the vessel 30B is connected to the reactor 20 vis the pressure-regulating part 25.

In the example shown in FIG. 1, two of the vessel 30A and the vessel 30B are connected to the processing system 1, however one of the vessel 30A or the vessel 30B may be provided.

The liquid sending part 40 transports the by-products gathered to the vessel 30A to the portable vessel 50 or the processing device 60. For example, the by-products are transported to the portable vessel 50 or the processing device 60 by regulating the pressure in the liquid sending part 40. For example, the by-products are transported to the portable vessel 50 or the processing device 60 by pressurizing from above the liquid sending part 40. The by-products may be transported to the portable vessel 50 or the processing device 60 without regulating the pressure in the liquid sending part 40.

The liquid sending part 40 is connected to the vessel 30A, and connected to the portable vessel 50 and the processing device 60. In the example shown in FIG. 1, although the liquid sending part 40 is connected to the vessel 30A, the liquid sending part 40 may be connected to the vessel 30B. In this case, the liquid sending part 40 is connected to the vessel 30B, and connected to the portable vessel 50 and the processing device 60. The liquid sending part 40 may be connected to one of the portable vessel 50 and the processing device 60.

The configuration of the liquid sending part 40 will be described later in detail.

The portable vessel 50 is a vessel storing temporally the by-products transported from the liquid sending part 40. The portable vessel 50 including the by-products is carried to the processing device 60. The by-products may be transported from the liquid sending part 40 to the processing device 60 without being stored temporally in the portable vessel 50. That is, the portable vessel 50 and the processing device 60 are destination parts to be transported which transport the by-products from the vessel 30A via the liquid sending part 40.

The processing device 60 makes the by-products carried from the portable vessel 50 harmless by processing. The by-products of silicon compound or the like is made harmless by detoxication treatment of the processing device 60.

The processing system 1 may be provided with a controller controlling operations of various components in the processing system 1. The controller is, for example, a computer, and is configured be capable of transmit a control signal to the various components in the processing system 1.

The processing system 1 may be provided with a display part that the worker monitors the operations of the various components in the processing system 1. The display part is, for example, a display device such as a display or the like.

Figure 2:
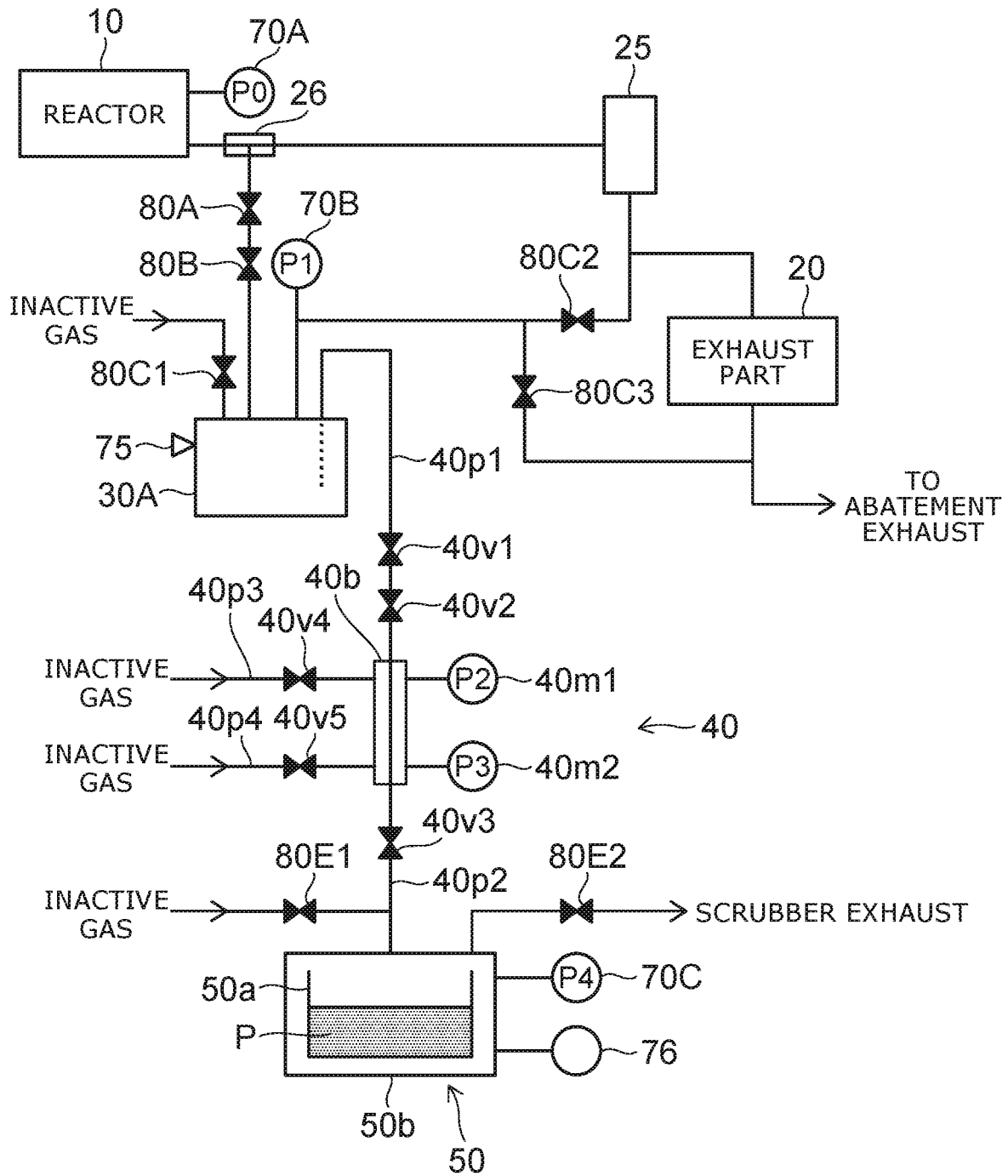
FIG. 2 is a view showing the configuration example of the processing system according to the embodiment.
Figure 3:
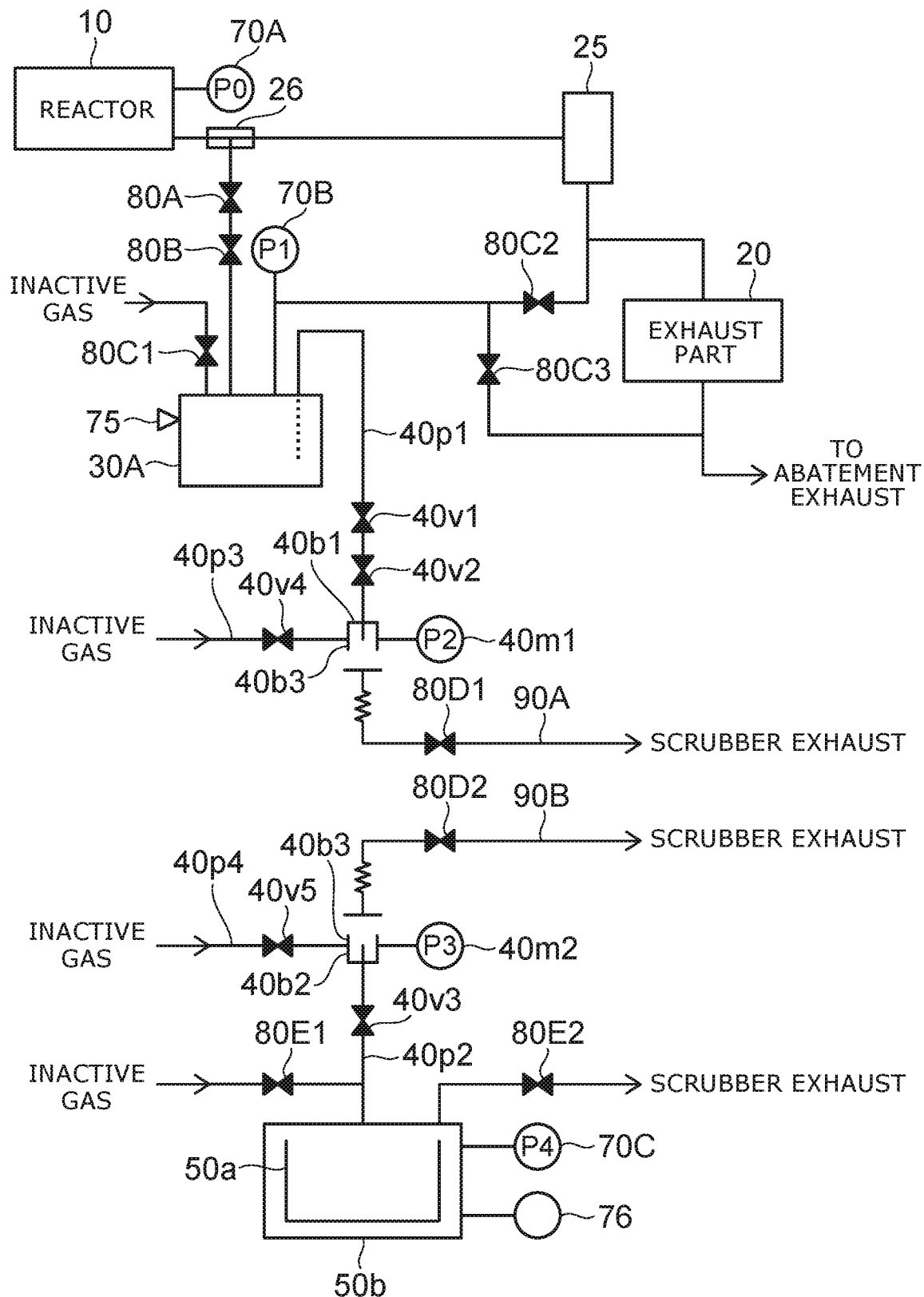
FIG. 3 is a view showing the configuration example of the processing system according to the embodiment.

FIG. 2 and FIG. 3 are views showing the configuration example of the processing system 1 according to the embodiment.

FIG. 2 and FIG. 3 show the configuration example of portion surrounded by a broken line in FIG. 1. FIG. 2 shows the figure of a coupled main body part 40b of the liquid sending part 40, and shows connection of the vessel 30A and the portable vessel 50 via the liquid sending part 40. FIG. 3 shows the figure of the not coupled main body part 40b in the liquid sending part 40, and shows no connection of the vessel 3- A and the portable vessel 50.

As shown in FIG. 2, the reactor 10 is provided with a pressure gauge 70A. The pressure in the reactor 10 is measured by the pressure gauge 70A to be regulated.

A trap part 26 is provided between the reactor 10 and the pressure regulator part 25. The trap part 26 separates the gas or the like occurred in the reactor 10 from liquid.

Valves 80A, 80B are provided between the trap part 26 and the vessel 30A. The by-products are transported from the reactor 10 to the vessel 30A by opening the valves 80A, 80B.

The vessel 30A is provided with a pressure gauge 70B and a sensor 75. The pressure in the vessel 30A is measured by the sensor 70B to be regulated. The sensor 75 is a liquid level sensor, and the level of liquid surface of the liquid of the by-products or the like in the vessel 30a is measured by the sensor 75.

Inactive gases such as argon (Ar) and nitrogen (N) or the like flow into the vessel 30A via a pipe. A valve 80C1 is provided between a gas supply source (not shown) and the vessel 30A, and the inactive gases are flown into the vessel 30A by opening the valve 80C1.

Valves 80C2, 80C3 are provided between the vessel 30A and the exhaust part 20. The pressure in the vessel 30A is regulated by opening/closing the valve 80C2. The gas in the vessel 30A is sent to the exhaust part 20 and the abatement device by opening the valve 80C3.

The liquid sending part 40 includes the main body part 40b, pipes 40p1, 40p2, 40p3, 40p4, valves 40v1, 40v2, 40v3, 40v4, 40v5, and pressure gauges 40m1, 40m2.

As shown in FIG. 3, the main body part 40b includes a first portion 40b1, a second portion 40b2, and a coupling portion 40b3. The first portion 40b1 and the second portion 40b2 are configured to be detachable in the main body part 40b by the coupling portion 40b3. Thereby, the first portion 40b1 and the second portion 40b2 are coupled each other by the coupling portion 40b3.

In a state in which the first portion 40b1 and the second portion 40b2 are not coupled, he first portion 40b1 and the second portion 40b2 are connected to a scrubber device (not shown) via a pipe 90A and a pipe 90B. The gases exhausted from the first portion 40b1 and the second portion 40b2 via the pipes 90A, 90B by opening valves 80D1, 80D2 are processed by the scrubber device, and thereafter are discharged to the external space (scrubber exhaust). This can prevent exhaust or overpressure of hazardous gas such as hydrogen chloride gas in the first portion 40b1 and the second portion 40b2. For example, in a state in which the first portion (second portion) is connected to the pipe 90A (valve 90B), the valve 40v4 (40v5) is opened, and thereby the inside of the first portion 40b1 (second portion 40b2) can be purged by the inactive gases through the pipe 40p3 (40p4). At this time, if the pressure is monitored by the pressure gauge 40m1 (pressure gauge 40m2), and the valve 80D1 (80D2) is set to be opened when the pressure exceeds the atmospheric pressure, the inside of the first portion 40b1 (second portion 40b2) does not reach the over pressure. That is, when the pipe 90A (pipe 90B) is removed, the risk accompanied with gas ejection is not caused. Under the condition, it is possible to remove the pipe 90A (pipe 90B) in the state in which the first portion 40b1 (second portion 40b2) is purged by the inactive gases, and thus exposure to the atmosphere of a by-products exhaust nozzle (nozzle receiver) in the first portion 40b1 (second portion 40b2) can be prevented.

The pipe 40p1 connects the vessel 30A to the first portion 40b1 of the main body part 40b.

The pipe 40p2 connects the second portion 40b2 of the main body part 40b to the portable vessel 50.

The pipe 40p3 connects the gas supply source (not shown) to the first portion 40b1 of the main body part 40b.

The pipe 40p4 connects the gas supply source (not shown) to the second portion 40b2 of the main body part 40b.

The valves 40v1, 40v2 are provided between the vessel 30A and the first portion 40b1 of the main body part 40b.

The valve 40v3 is provided between the second portion 40b2 of the main body part 40b and the portable vessel 50.

The valve 40v4 is provided between the gas supply source (not shown) and the first portion 40b1 of the main body part 40b.

The valve 40v5 is provided between the gas supply source (not shown) and the second portion 40b2 of the main body part 40b.

The by-products are transported from the vessel 30A to the main body part 40b via the pipe 40p1 by opening the valves 40v1, 40v2.

The by-products are transported from the main body part 40b to the portable vessel 50 via the pipe 40p2 by opening the valve 40v3.

The inactive gases flow into the main body part 40b via the pipes 40p3, 40p4 by opening the valves 40v4, and 40v5.

The pressure gauge 40m1 and the pressure gauge 40m2 are provided on the first portion 40b1 and the second portion 40b2 of the main body part 40b, respectively. The pressures in the main body part 40b are measured by the pressure gauges 40m1, 40m2 to be regulated. For example, on the basis of the measured values of the pressure gauge 40m1 and the pressure gauge 40m2, the inactive gases flow into the main body part 40b, or supply of the inactive gases to the main body part 40b is stopped.

On the basis of the measured values of the pressure gauge 40m1 and the pressure gauge 40m2, it may be determined whether the by-products are transported or not. For example, on the basis that the measured values of the pressure gauge 40m1 and the pressure gauge 40m2 are prescribed values, and the signal saying that preparation is made is received from the main body part 40b (for example, a receiving part 40b5 described later), it is determined automatically whether the by-products are transported or not. In this way, since it is determined automatically whether the by-products are transported or not, it is suppressed that the atmosphere is introduced by an error opening of the valves 40v1, 40v2, and 40v3 to the vacuum.

The processing system 1 may be configured so that transmission and reception of a state signal are made on both of the destination of the by-products (for example, the portable vessel 50 and the processing device 60) or the source of the by-products (for example, the vessel 30A).

The processing system 1 may be provided with a mechanism determining the operation based on the states of the pressure gauges 40m1, 40m2, and the main body part 40b, and the state signals of the destination and the source, for example, an interlock.

As shown in FIG. 2, the portable vessel 50 includes a vessel body 50a and a cover 50b. The by-products P are stored in the vessel body 50a. The cover 50b covers the surrounds of the vessel body 50a. The vessel body 50a is protected by the cover 50b and the by-products are suppressed from leaking from the vessel body 50a.

The portable vessel 50 is provided with a pressure gauge 70C and a concentration meter 76 (a gas concentration meter). The pressure in the potable vessel 50 is measured by the pressure gauge 70C to be regulated. An oxygen concentration and a moisture concentration in the portable vessel 50 are measured by the concentration meter 76.

The inactive gases flow into the portable vessel 50 via a pipe. A valve 80E1 is provided between the gas supply (not shown) and the portable vessel 50, and the inactive gases flow into the portable vessel 50 by opening the valve 80E1.

The portable vessel 50 is connected to the scrubber device (not shown) via a pipe. The gas exhausted from the portable vessel 50 by opening a valve 80E2 is processed in the scrubber device, and thereafter is discharged to the external space (scrubber exhaust).

Next, the configuration example of the main body part 40b in the liquid sending part 40 will be described.

FIG. 4A and FIG. 4B are views showing a portion of the processing system of the embodiment, respectively.

FIG. 5 is a view showing a portion of the processing system according to the embodiment.

FIG. 4A, FIG. 4B and FIG. 5 show the first portion 40b1 and the second portion 40b2 of the main body part 40b in the liquid sending part 40, respectively. FIG. 4A and FIG. 4B show the figure of the coupled first portion 40b1 and the second portion 40b2 of the main body part 40b, respectively, FIG. 5 shows the figure of the not coupled first portion 40b1 and the second portion 40b2 of the main body part 40b.

As shown in FIG. 4A and FIG. 4B, in the main body part 40b, the first portion 40b1 is an internal pipe, and the second portion 40b2 is a receiving side pipe. The main body part 40b is configured so that the main body part 40b is a double pipe by coupling the first portion 40b to the second portion 40b2 by the coupling portion 40b3. The by-products are suppressed from contacting the atmosphere by making the main body part the double pipe.

The first portion 40b1 includes a nozzle 40b4. The nozzle 40b4 is a portion discharging the by-products, and is, for example, a pipe. The nozzle 40b4 is connected to the pipe 40p1.

The second portion 40b2 includes the receiving part 40b5, an elastic part 40b6 (sliding part, for example), and a guide part 40b7. The receiving part is a portion receiving the by-products from the nozzle 40b4, and is, for example, a pipe. The receiving part 40b5 is connected to the pipe 40p2. The elastic part 40b6 is, for example, a stretchable portion including an elastic body such as a spring or the like. The main body part 40b stretches along the guide part 40b7 by stretching of the elastic part 40b6.

It is desired that the nozzle 40b4 is superimposed on the receiving part 40b5. The by-products are suppressed from scattering from the tip of the nozzle 40b4 during liquid sending by the receiving part 40b4 surrounding a side surface of the tip of the nozzle 40b4.

As shown in FIG. 4A, after the first portion 40b1 and the second portion 40b2 are coupled by the coupling portion 40b3, as shown in FIG. 4B, during liquid sending (during pressure feeding), the second portion 40b2 shrinks due to shrinking of the elastic part 40b6, and a portion of the receiving part 40b5 pierces the coupling portion 40b3. Thereby, the nozzle 40b4 of the first portion 40b1 is superimposed on the receiving part 40b5 of the second portion 40b2.

In the case of not sending liquid as in FIG. 4A, a portion of the receiving part 40b5 pierces the coupling portion 40b3, and thus the nozzle 40b4 may be superimposed on the receiving part 40b5.

The inactive gases flow into the first portion 40b1 of the main body part 40b via the pipe 40p3. The inactive gases flow into the second portion 40b2 of the main body part 40b via the pipe 40p4. The main body part 40b is purged by the inactive gases. The inactive gases flow into the main body part 40b via the pipes 40p3, 40p4, and thus air is suppressed from entering the main body part 40b.

As shown in FIG. 5, in the state in which the first portion 40b1 and the second portion 40b2 of the main body part 40b are not coupled, the first portion 40b1 and the second portion 40b2 are connected to the scrubber device, the gases exhausted from the first portion 40b1 and the second portion 40b2 are processed by the scrubber device, and thereafter are discharged to the external space.

Next, the configuration example of the nozzle 40b4 in the liquid sending part 40 will be described.

Figure 6A:
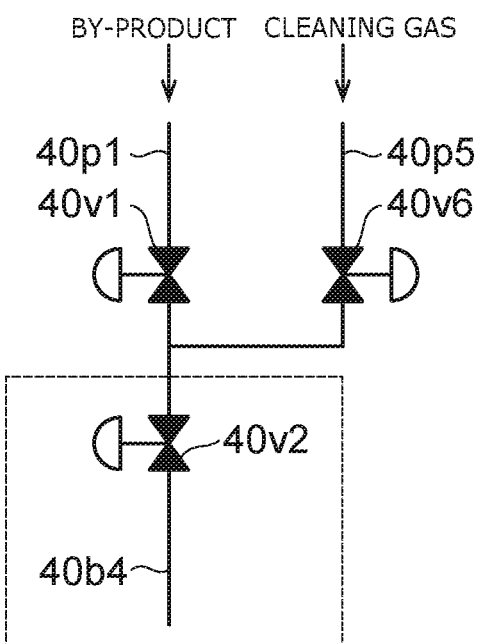
FIG. 6A and FIG. 6B are views showing a portion of the processing system according to the embodiment, respectively.
Figure 6B:
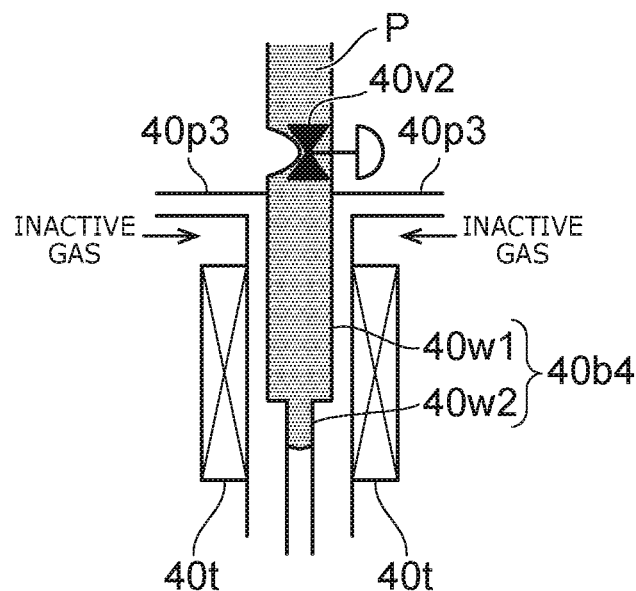

FIG. 6A and FIG. 6B are views showing a portion of the processing system according to the embodiment, respectively.

FIG. 6A is a view showing the pipe 40p1 and the nozzle 40b4. FIG. 6B shows the configuration example of an enlarged portion surrounded by the broken line of FIG. 6A.

As shown in FIG. 6A, the by-products are transported from the vessel 30A to the main body part 40b via the pipe 40p1 by opening the valves 40v1, 40v2. In order to wash inside the valve 40v2, a pipe 40p5 is provided between the valve 40v1 and the valve 40v2. The inside of the valve 40v2 is washed by opening a valve 40v6 to flow a cleaning gas and a cleaning solution via the pipe 40p5.

As shown in FIG. 6B, the nozzle 40b4 includes a broad width portion 40w1 and a narrow width portion 40w2. The narrow width portion 40w2 is a portion having a smaller width than the broad width portion 40w1. The broad width portion 40w1 is connected to the narrow width portion 40w2, and the narrow width portion 40w2 is located at a tip of the nozzle 40b4. That is, the nozzle 40b4 has a width decreasing stepwisely toward the receiving part 40b5. Since the nozzle 40b4 includes the narrow width portion 40w2, the by-products P are suppressed from remaining in the tip (narrow width portion 40w2) of the nozzle 40b4, and the by-products are suppressed from scattering from the tip of the nozzle 40b4.

The pipe 40p3 is located on a side surface of the nozzle 40b4. The pipe 40p3 covers the side surface of the nozzle 40b4, the inactive gases flow into the first portion 40b1 of the main body part 40b via the pipe 40p3. Since the pipe 40p3 covers the side surface of the nozzle 40b4, the tip of the nozzle 40b4 is suppressed from contacting the atmosphere.

It is desired that the discharge of the inactive gas from the pipe 40p3 and the discharge of the by-products P from the nozzle 40b4 are not made simultaneously. Thereby, the by-products P are suppressed from scattering from the tip of the nozzle 40b4.

A temperature-regulating part 40t is provided on a side surface of the pipe 40p3. The temperature of the nozzle 40p4 is regulated by the temperature-regulating part 40t via the pipe 40p3. The temperature-regulating part 40t includes, for example, a heater. For example, in the case where the viscosity of the by-products P of liquid is high, it is desired that the temperature of the nozzle 40b4 is made higher by the heater and the viscosity of the by-products P is lowered. It is suppressed that the by-products P remain in the nozzle 40b4 by the clogging of the by-products in the nozzle 40b4.

Next, a variation of the nozzle 40b4 in the liquid sending part 40 will be described.

Figure 7:
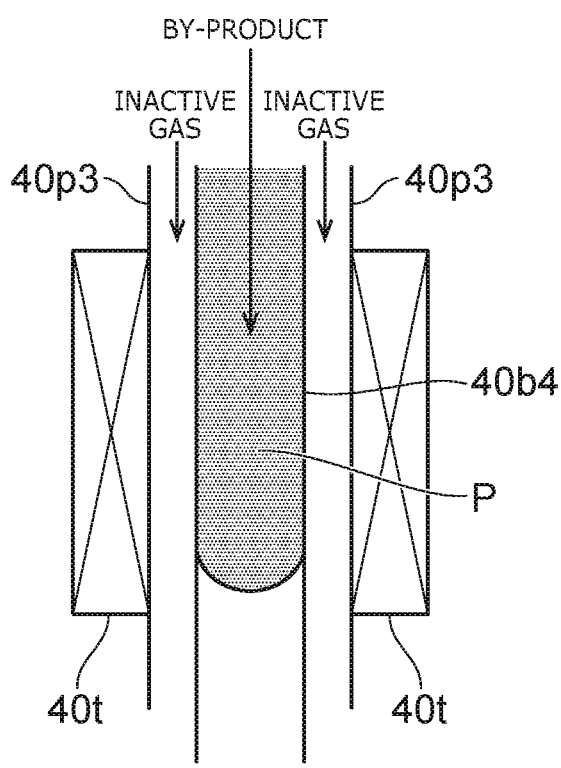
FIG. 7 is a view showing a portion of a processing system according to a first variation of the embodiment.
Figure 8:
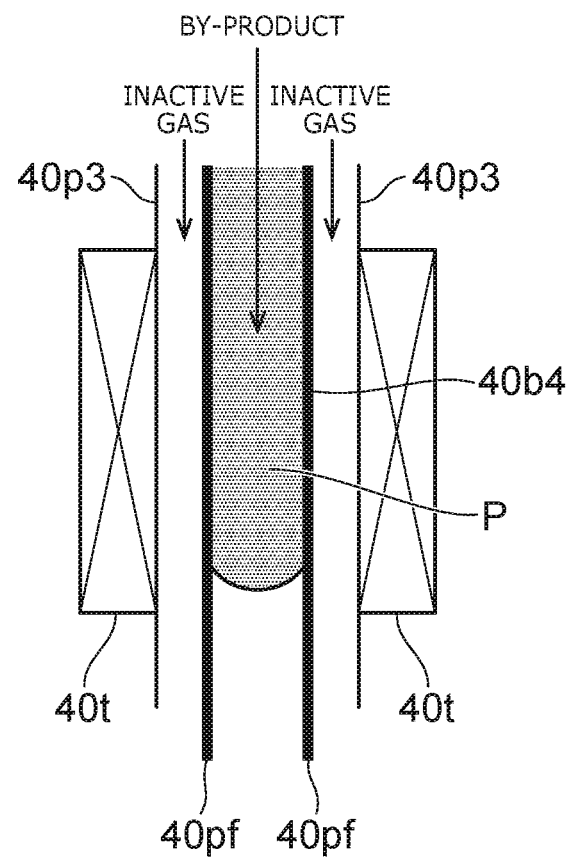
FIG. 8 is a view showing a portion of a processing system according to a second variation of the embodiment.

FIG. 7 and FIG. 8 are views showing a portion of a processing system according to a first variation and a second variation of the embodiment, respectively.

Figure 9:
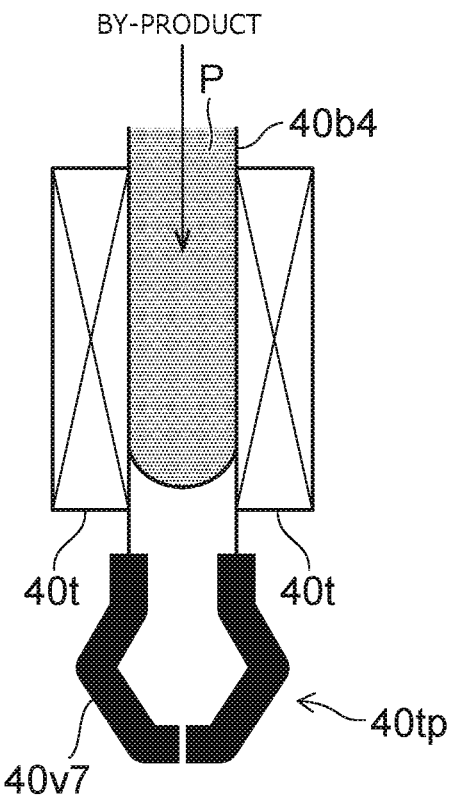
FIG. 9 is a view showing a portion of a processing system according to a third variation of the embodiment.
Figure 10A:
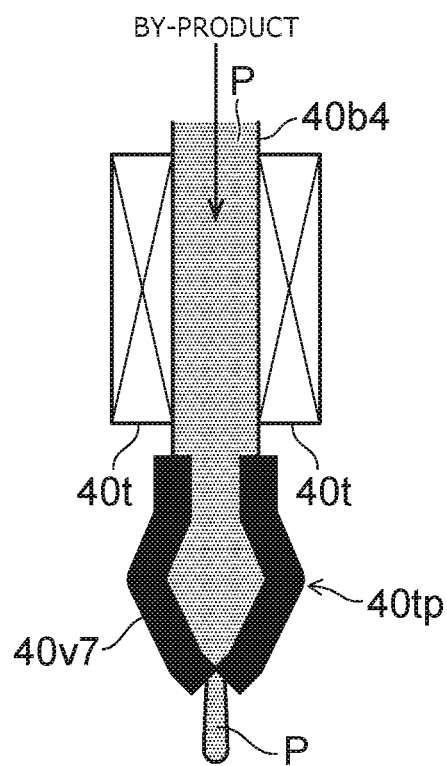
Figure 10B:
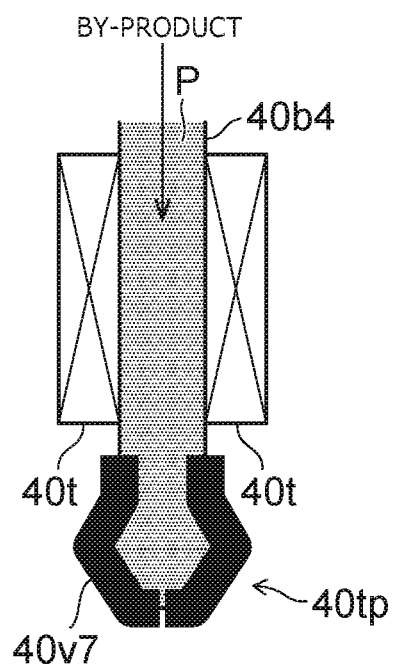

FIG. 9, FIG. 10A and FIG. 10B are views showing a portion of a processing system according to a third variation of the embodiment.

Regions shown in FIG. 7 to FIG. 9, FIG. 10A and FIG. 10B correspond to a portion of the region shown in FIG. 6B, respectively. FIG. 9 shows the figure before the by-products P arrive at a tip portion 40tp of the nozzle 40b4, and FIG. 10A and FIG. 10B show the figure that the by-products P are discharged from the tip portion 40tp of the nozzle 40b4 by opening/closing of a valve 40v7.

As shown in FIG. 7, the width of the nozzle 40b4 is generally constant. That is, different from the nozzle 40b4 in FIG. 6B, the nozzle 40b4 in FIG. 7 is not provided with the broad width portion 40w1 and the narrow width portion 40w2.

As shown in FIG. 8, a functional film 40pf is provided on an inner wall of the nozzle 40b4. It is desired that a liquid repellent material with a small surface tension is selected as the functional film 40pf. The inner wall surface of the nozzle 40b4 is covered by the functional film 40pf, and thus the by-products P are suppressed from remaining in the nozzle 40b4, and the by-products are suppressed from scattering from the tip of the nozzle 40b4.

As shown in FIG. 9, the valve 40v7 is provided on the tip portion 40tp of the nozzle 40b4. The valve 40v7 includes, for example, a resin. The by-products P remained without being discharged from the nozzle 40b4 can be accumulated in the nozzle 40b4 by elasticity of the valve 407v. By providing the valve 40v7 on the tip portion 40tp, the by-products P remained at the tip portion 40tp of the nozzle 40b4 are suppressed from contacting the atmosphere.

In the example shown in FIG. 9, the pipe 40p3 does not cover the side surface of the nozzle 40b4, and the temperature-regulating part 40t is located on the side surface of the nozzle 40b4.

As shown in FIG. 10A, if the pressure in the liquid sending part 40 increases during liquid sending, the by-products P are discharged from the nozzle 40b4 via the valve 40v7 by elasticity of the valve 40v7. As shown in FIG. 10B, if the pressure in the liquid sending part 40 is decreased after the discharge of the by-products P, the valve 40v7 is closed by elasticity of the valve 40v7. Thereby, since the by-products P remained at the tip portion 40tp are covered by the valve 40v7, the by-products P are suppressed from contacting the atmosphere via the tip portion 40tp.

Figure 11:
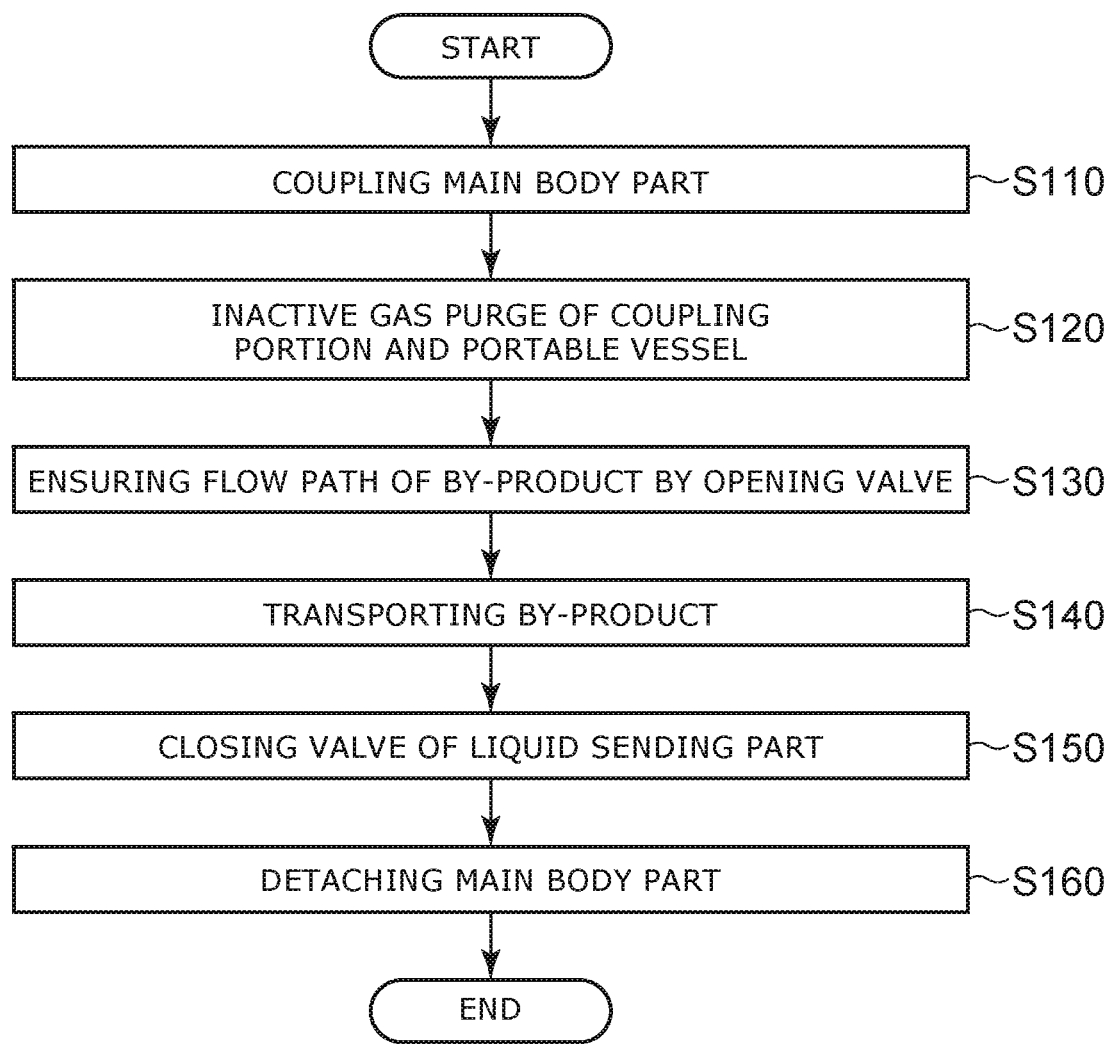
FIG. 11 is a flow chart showing a processing method according to the embodiment.

FIG. 11 is a flow chart showing a processing method according to the embodiment.

In the following, as one example, the processing method of the by-products in the processing system 1 of FIG. 2 will be described.

As shown in FIG. 11, in the liquid sending part 40, in a state in which the inactive gases are flown via the pipes 40p3, 40p4, the first portion 40b1 and the second portion 40b2 of the main body part 40b are coupled by the coupling portion 40b3 (S110). If the first portion 40b1 and the second portion 40b2 are coupled, the pressure in the main body part 40b is measured by the pressure gauges 40m1, 40m2. Thereafter, the supply of the inactive gases is stopped by the control signal of the controller, for example.

Next, the residue such as atmospheric constituent or the like) in the portable vessel 50 is removed by the inactive gases (S120). The purge by the inactive gases is performed for a prescribed time. The purge by the inactive gases is performed automatically by the control signal of the controller, for example. The purge by the inactive gas may be performed manually by opening/closing the valve 80E1 by the worker. Scrubber exhaust may be performed on the basis of the measured values of the pressure gauge 70C in place of the purge by the inactive gas.

Next, the valve 40v3 of the liquid sending part 40 is opened (S130). The valve 40v3 is provided between the main body part 40b (second portion 40b2) and the portable vessel 50. For example, the valve 40v3 may be provided with an interlock operating with the state of the potable vessel 50. For example, in the case where the measured values of the pressure gauge 70C and the concentration meter 76 of the portable vessel 50, and the measured values of the pressure gauge 40m2 of the liquid sending part 40 satisfy the set value, the valve 40v3 is tried to be opened.

Next, the valves 40v1, 40v2 of the liquid sending part 40 are opened, and the by-products are transported from the vessel 30a to the portable vessel 50 via the liquid sending part 40 (S140). In the case where the gathered by-products into the vessel 30A are transported, the pressure gauge 70B of the vessel 30a indicates the prescribed value (for example, a value not less than the normal pressure), the inactive gas is tried to be flown into the vessel 30A for the prescribed time by opening the valve 80C1. For example, the valves 40v1, 40v2 may be provided with an interlock operating with the state of the vessel 30A. For example, in the case where the measured value of the pressure gauge 70B of the vessel 30A satisfies the set value, the valves 40v1, 40v2 are tried to be opened.

Liquid sending work can be started depending on the state of the vessel 30a, the state of the portable vessel 50, and the opening/closing state of the valves 40v1, 40v2, and 40v3. The liquid sending work is, for example, performed automatically by the control signal of the controller. The liquid sending work may be performed manually by monitoring the display part by the worker. In order to improve the safety of the liquid sending work, the processing system 1 may be provided with an interlock of fail-safe or the like.

Next, after the by-products are transported to the portable vessel 50, a closed work is performed by closing the valves 40v1, 40v2, and 40v3 in order (S150).

For example, after transporting the by-products to the portable vessel 50, the valve 40v3 is closed after the valves 40v1, 40v2 are closed and a prescribed time passes. If the valves 40v1, 40v2, and 40v3 are closed in such a procedure, the by-products remained in the liquid sending part 40 can be collected below the liquid sending part 40.

Next, in a state in which the inactive gasses are flown via the pipes 40p3, 40p4 under measurements by the pressure gauges 40m1, 40m2, the first portion 40b1 and the second portion 40b2 of the main body part 40b are detached (S160). It is possible to protect the tip portion of the nozzle 40b4 of the first portion 40b1 from reacting with atmospheric constituent (member corrosion, hydrolysis of the residual by-products, or the like) by detaching the first portion 40b1 and the second portion 40b2 in the state of the inactive gasses flown. After that, the portable vessel 50 is carried to the processing device 60, and a harmless work is performed.

In this way, by transporting the by-products from the vessel 30A to the portable vessel 50 using the liquid sending part 40, it is possible to transport the by-products to an appropriate place (for example, the processing device 60) in a form independent from both the reactor 10 and a facility connected to the reactor 10.

Next, the effects of the embodiment will be described.

In a semiconductor manufacturing device such as an epitaxial growth device or the like based on silane gas, for example, the liquid-like by-products including silicon compound may be generated in the manufacturing process, and is accumulated in the pipes connected to the semiconductor manufacturing device. If the by-products accumulated in the pipes are exposed to the atmosphere in maintenance, a chemical reaction with moisture in the atmosphere is caused and hydrogen chloride gas and hydrogen gas having toxicity are generated. In the case of using silane chloride for the manufacturing process, the by-products including trichlorosilane and hexachlorosilane are generated. Since trichlorosilane and hexachlorosilane are hydrolytic, if these silane chloride polymers hydrolyze by exposure to the atmosphere, silico-oxalic acid ($H_2Si_2O_4$) or the like is generated. Since silico-oxalic acid is a compound which is highly combustible and explosive, the chemical reaction of these by-products influences to the safety of the manufacturing process.

Here, the by-products may be transported (for example, liquid sending) from the reactor to a storage vessel or the processing device via the pipes. However, when the by-products are transported to the storage vessel or the processing device for discarding the by-products, there is a fear that the by-products hydrolyze due to the exposure to the atmosphere.

In the case where the storage vessel and the processing device are transported via the pipes, positions or spaces where the storage vessel and the processing device are set become easy to be limited. Furthermore, there is a case where the pipes to the storage vessel and the processing device are formed to be long, and with increasing length of the pipes, a risk of hydrolysis of the by-products increases due to the exposure to the atmosphere of the by-products in maintenance. Furthermore, if the by-products are highly viscous, the by-products are supposed to be clogged in the middle of the pipes, and the risk in liquid-sending increases.

If the by-products are highly viscous, the by-products are easy to adhere and remain on connecting portions between the pipes and the storage vessel or the processing device. In the case where these connecting portions of the pipes are configured to be detachable, there is a risk that the by-products remained on the connecting portions hydrolyze due to the exposure of the by-products to the atmosphere when detaching. Furthermore, if the by-products are subjected to liquid sending into the pipes based on the inactive gasses, the by-products of liquid scatter with bubbles and becomes easy to adhere to the connecting portions. If the by-products remain on the connecting portions, there is a fear that the by-products hydrolyze due to the exposure to the atmosphere.

The processing system 1 of the embodiment is provided with the liquid sending part 40 including the main body part 40b between the vessel 30A and the portable vessel 50. The main body part 40b of the liquid sending part 40 includes the first portion 40b1 and the second portion 40b2 coupling each other, the first portion including the nozzle 40b4, the second portion 40b2 including the receiving part 40b5. The nozzle 40b4 discharges the liquid-like by-products gathered into the vessel 30A to the receiving part 40b5. By providing the liquid sending part 40, the by-products are suppressed from contacting the atmosphere when the by-products are transported from the vessel 30A to the portable vessel 50. By transporting the by-products to the portable vessel 50 so as to be independent from a film formation device in this way, it is possible to safety transport the by-products to the faraway processing device 60. Thereby, the by-products are suppressed from exposing to the atmosphere to hydrolyze, and the safety of the manufacturing process can be improved.

According to the embodiment, the processing system and the processing method with improved safety in the manufacturing process are provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A processing system comprising:
   a first vessel configured to gather a product being liquid temporarily;
   a destination part to be transported including a second vessel configured to gather the product transported from the first vessel;
   a liquid sending part including a first portion and a first pipe, the first portion including a nozzle and a first mechanism, the nozzle configured to discharge the product provided between the first vessel and the destination part to be transported, the first mechanism being purged by an inactive gas, the first pipe being around the nozzle, the inactive gas flowing inside the first pipe, the nozzle and the first pipe forming a double pipe; and
   a temperature-regulating part provided on a side surface of the first pipe.

2. The system according to claim 1, wherein the liquid sending part includes a second portion coupled to the first portion, and the second portion includes a receiving part to receive the product discharged from the nozzle.

3. The system according to claim 2, wherein the nozzle includes a tip portion, the second portion has a double structure surrounding the tip portion to suppress a scattering or a leakage of the product.

4. The system according to claim 2, wherein the liquid sending part further includes a third portion coupling the first portion and the second portion, and a portion of the receiving part is coupled with the nozzle directly or indirectly when coupling the first portion and the second portion.

5. The system according to claim 2, wherein the second portion further includes a guide part to suppress a mismatching in the first portion the nozzle and a sliding part being extendable along the guide part.

6. The system according to claim 2, wherein the nozzle has a second mechanism, a width of the second mechanism decreases in a stepwise configuration toward a tip of the nozzle.

7. The system according to claim 2, wherein the destination part to be transported has a portable mechanism,
   the portable mechanism includes the second vessel, a second pipe to couple the nozzle, and a third pipe to couple the receiving part and a portable vessel.

8. The system according to claim 1, further comprising: a functional film provided on an inner wall surface of the nozzle.

9. The system according to claim 1, further comprising:
   a processing device configured to detoxify the product in the destination part to be transported.

10. The system according to claim 1, wherein the destination part to be transported further includes a mechanism purged by an inactive gas.

11. The system according to claim 1, wherein transmission and reception of a state signal are made on at least one of a first channel, a second channel, or a third channel, the first channel being between a gas consumption equipment being provided with the first vessel and the liquid sending part including the first portion, the second channel being between the gas consumption equipment and the destination part to be transported, the third channel being between the liquid sending part including the first portion and the destination part to be transported.

12. A processing system comprising:
   a first vessel configured to gather a product being liquid temporarily;
   a destination part to be transported including a second vessel configured to gather the product transported from the first vessel;
   a liquid sending part including a first portion, the first portion including a nozzle and a first mechanism, the nozzle configured to discharge the product provided between the first vessel and the destination part to be transported, the first mechanism being purged by an inactive gas; and
   an elastic valve provided on a tip portion of the nozzle, the elastic valve having a self opening and closing function to discharge the product from the nozzle and/or to stop a discharging.

13. The system according to claim 12, wherein the liquid sending part includes a second portion coupled to the first portion, and the second portion includes a receiving part to receive the product discharged from the nozzle.

14. The system according to claim 13, wherein the nozzle includes a tip portion, the second portion has a double structure surrounding the tip portion to suppress a scattering or a leakage of the product.

15. The system according to claim 13, wherein the second portion further includes a guide part to suppress a mismatching in the first portion the nozzle and a sliding part being extendable along the guide part.

16. A processing system comprising:
   a first vessel configured to gather a product being liquid temporarily;
   a destination part to be transported including a second vessel configured to gather the product transported from the first vessel; and
   a liquid sending part including a first portion, a second portion coupled to the first portion, a third portion coupling the first portion and the second portion, and at least one of a pressure gauge or a gas concentration meter,
   the first portion including a nozzle and a first mechanism,
   the nozzle configured to discharge the product provided between the first vessel and the destination part to be transported,
   the first mechanism being purged by an inactive gas,
   the second portion including a receiving part to receive the product discharged from the nozzle
   a portion of the receiving part being coupled with the nozzle directly or indirectly when coupling the first portion and the second portion, and
   the pressure gauge measuring a pressure of the first portion, a pressure of the second portion, a pressure of the third portion, and a pressure of the destination part to be transported, and the gas concentration meter detecting an outer leakage.

17. The system according to claim 16, wherein the nozzle includes a tip portion, the second portion has a double structure surrounding the tip portion to suppress a scattering or a leakage of the product.

18. A processing system comprising:
   a first vessel configured to gather a product being liquid temporarily;
   a destination part to be transported including a second vessel and a mechanism, the second vessel configured to gather the product transported from the first vessel, the mechanism purged by an inactive gas;
   a liquid sending part including a first portion, the first portion including a nozzle and a first mechanism, the nozzle configured to discharge the product provided between the first vessel and the destination part to be transported, the first mechanism being purged by an inactive gas; and an interlock, transmission and reception of a state signal being made on at least one of a first channel, a second channel, or a third channel, the first channel being between a gas consumption equipment being provided with the first vessel and the liquid sending part including the first portion, the second channel being between the gas consumption equipment and the destination part to be transported, the third channel being between the liquid sending part including the first portion and the destination part to be transported, the interlock determining operation based on state grab by at least one of a pressure gauge of the liquid sending part, a gas concentration meter, the mechanism of the destination part to be transported, or the state signal.

19. The system according to claim 18, wherein the liquid sending part includes a second portion coupled to the first portion, and the second portion includes a receiving part to receive the product discharged from the nozzle.

20. The system according to claim 19, wherein the nozzle includes a tip portion, the second portion has a double structure surrounding the tip portion to suppress a scattering or a leakage of the product.

* * * * *